US009621179B1

(12) United States Patent
Maulik et al.

(10) Patent No.: US 9,621,179 B1
(45) Date of Patent: Apr. 11, 2017

(54) METASTABILITY ERROR REDUCTION IN ASYNCHRONOUS SUCCESSIVE APPROXIMATION ANALOG TO DIGITAL CONVERTER

(71) Applicant: APPLIED MICRO CIRCUITS CORPORATION, Santa Clara, CA (US)

(72) Inventors: Prabir Maulik, Santa Clara, CA (US); Nanda Govind, Santa Clara, CA (US)

(73) Assignee: APPLIED MICRO CIRCUITS CORPORATION, Santa Clara, CA (US)

( * ) Notice: Subject to any disclaimer, the term of this patent is extended or adjusted under 35 U.S.C. 154(b) by 0 days.

(21) Appl. No.: 15/067,293

(22) Filed: Mar. 11, 2016

(51) Int. Cl.
H03M 1/10 (2006.01)
H03M 1/46 (2006.01)

(52) U.S. Cl.
CPC .............. *H03M 1/466* (2013.01); *H03M 1/46* (2013.01); *H03M 1/462* (2013.01)

(58) Field of Classification Search
CPC ........ H03M 1/125; H03M 1/462; H03M 1/46; H03M 1/12; H03M 1/66; H03M 1/804
USPC .......................... 341/118, 120, 144, 155, 172
See application file for complete search history.

(56) References Cited

U.S. PATENT DOCUMENTS

| 8,717,221 | B2 | 5/2014 | Jeon et al. | |
| 8,872,691 | B1* | 10/2014 | Stepanovic | H03M 1/06 341/144 |
| 8,922,415 | B2 | 12/2014 | Fogleman et al. | |
| 8,928,515 | B1 | 1/2015 | Hu et al. | |
| 8,957,802 | B1* | 2/2015 | Evans | H03M 1/0863 341/155 |
| 9,013,442 | B2 | 4/2015 | Hotelling et al. | |
| 9,054,721 | B1 | 6/2015 | Li et al. | |
| 9,136,859 | B2 | 9/2015 | Fogleman et al. | |
| 9,197,240 | B1 | 11/2015 | Kinyua | |
| 9,219,492 | B1 | 12/2015 | Lok et al. | |
| 9,252,800 | B1 | 2/2016 | Park et al. | |
| 9,258,008 | B2 | 2/2016 | Singh et al. | |
| 9,270,293 | B2 | 2/2016 | Mandal | |
| 2010/0085225 | A1* | 4/2010 | Chang | H03M 1/069 341/110 |
| 2011/0063147 | A1* | 3/2011 | Yoshioka | H03M 1/462 341/118 |
| 2012/0262315 | A1* | 10/2012 | Kapusta | H03M 1/125 341/110 |
| 2013/0069807 | A1* | 3/2013 | Sestok | H03M 7/00 341/110 |
| 2013/0099953 | A1* | 4/2013 | Tsai | H03M 1/462 341/161 |
| 2013/0162454 | A1* | 6/2013 | Lin | H03M 1/38 341/120 |
| 2014/0022105 | A1* | 1/2014 | Chen | H03M 1/38 341/161 |

(Continued)

*Primary Examiner* — Linh Nguyen
(74) *Attorney, Agent, or Firm* — Amin, Turocy & Watson LLP

(57) ABSTRACT

Various aspects facilitate error reduction for an analog to digital converter (e.g., due to metastability). A digital to analog converter generates a scaled reference voltage based on a reference voltage. A comparator component performs a comparison between an input voltage and the scaled reference voltage based on a defined period of time to perform the comparison.

20 Claims, 8 Drawing Sheets

(56) References Cited

U.S. PATENT DOCUMENTS

2015/0263755 A1* 9/2015 Confalonieri ....... H03M 1/1019
　　　　　　　　　　　　　　　　　　　　　341/120
2015/0263756 A1* 9/2015 Chiu ................... H03M 1/468
　　　　　　　　　　　　　　　　　　　　　341/118

* cited by examiner

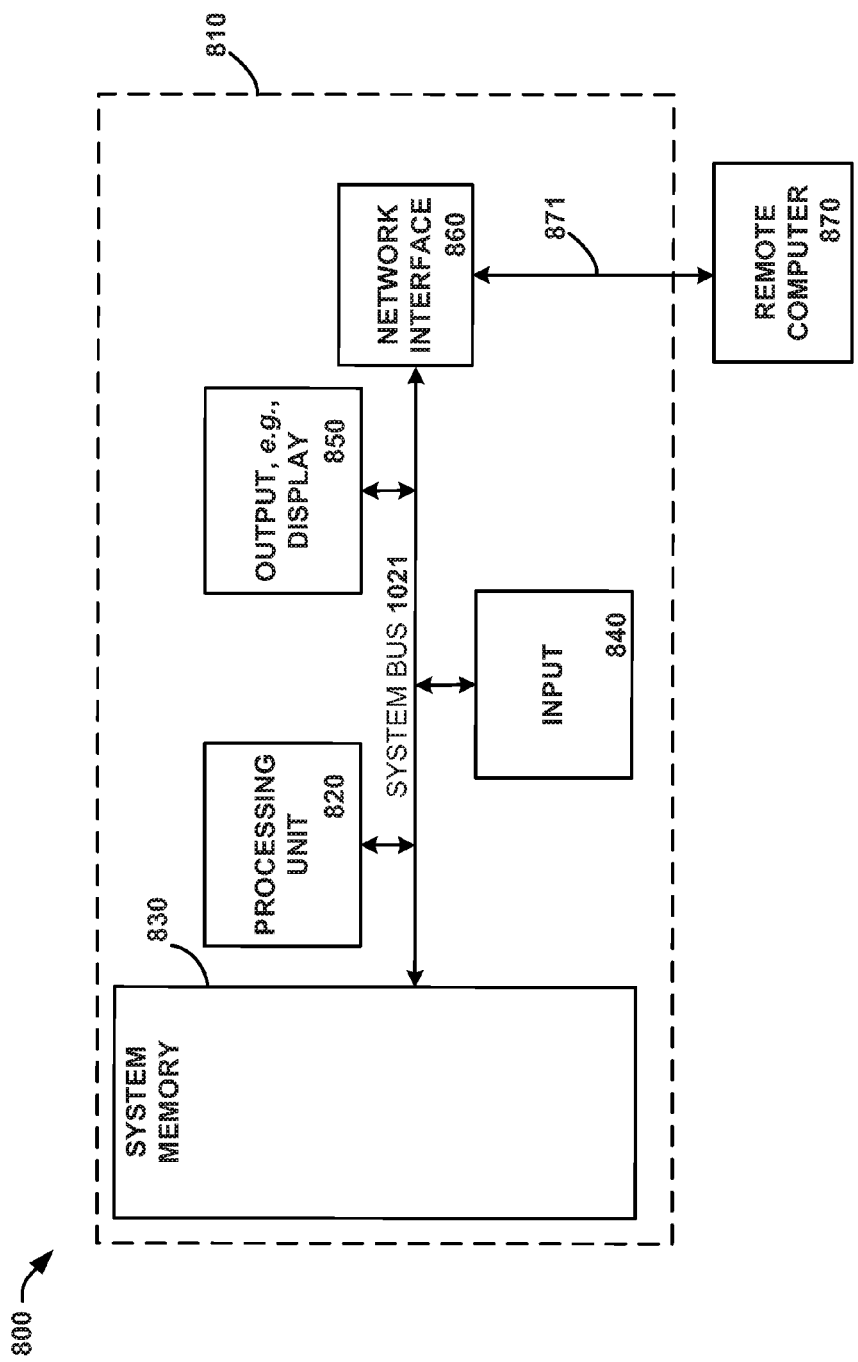

US 9,621,179 B1

METASTABILITY ERROR REDUCTION IN ASYNCHRONOUS SUCCESSIVE APPROXIMATION ANALOG TO DIGITAL CONVERTER

TECHNICAL FIELD

The subject disclosure relates generally to analog to digital converters, and more particularly to performing a comparison associated with an analog to digital converter based on a defined period of time.

BACKGROUND

A successive approximation register (SAR) analog to digital converter (ADC) is often employed in electronic systems to convert an analog signal into a digital representation of the analog signal via a charge scaling circuit that performs a binary search algorithm and a comparator. The charge scaling circuit generally includes an array of capacitors that is employed to perform the binary search algorithm. The comparator generally compares the analog signal to a signal generated by the charge scaling circuit. However, the comparator can become stalled (e.g., enter a stalled state, enter an undecided state, etc.) when comparing the analog signal to the signal generated by the charge scaling circuit. As such, the comparator can provide inaccurate results and/or the digital representation of the analog signal can be incorrect. Moreover, future comparisons by the comparator can be negatively affected by a stalled comparator.

The above-described description is merely intended to provide a contextual overview of current SAR ADC systems and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a system comprises a digital to analog converter and a comparator. The digital to analog converter is configured for generating a scaled reference voltage based on a reference voltage. The comparator component is configured for performing a comparison between an input voltage and the scaled reference voltage based on a defined period of time to perform the comparison.

In another example embodiment, a method comprises receiving an input voltage to be converted into a digital value, generating a scaled reference voltage based on a reference voltage, and performing a comparison between the input voltage and the scaled reference voltage based on a defined period of time for performing the comparison.

In yet another example embodiment, a system comprises a register and a control component. The register is configured for storing a digital value provided by a comparator that compares an input voltage to a scaled reference voltage generated by a digital to analog converter. The control component is configured for controlling a binary search algorithm associated with the digital to analog converter, where an analog to digital conversion process for the input voltage is stopped in response to a determination that the comparator has not completed a comparison between the input voltage and the scaled reference voltage within an interval of time defined for the comparison. In an aspect, the determination that the comparator has not completed the comparison between the input voltage and the scaled reference voltage within the interval of time defined for the comparison can signal that the comparator is in a metastable state.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

BRIEF DESCRIPTION OF THE DRAWINGS

FIG. 8 illustrates a block diagram of an example electronic computing environment that can be implemented in conjunction with one or more aspects described herein.

DETAILED DESCRIPTION

Figure 1:
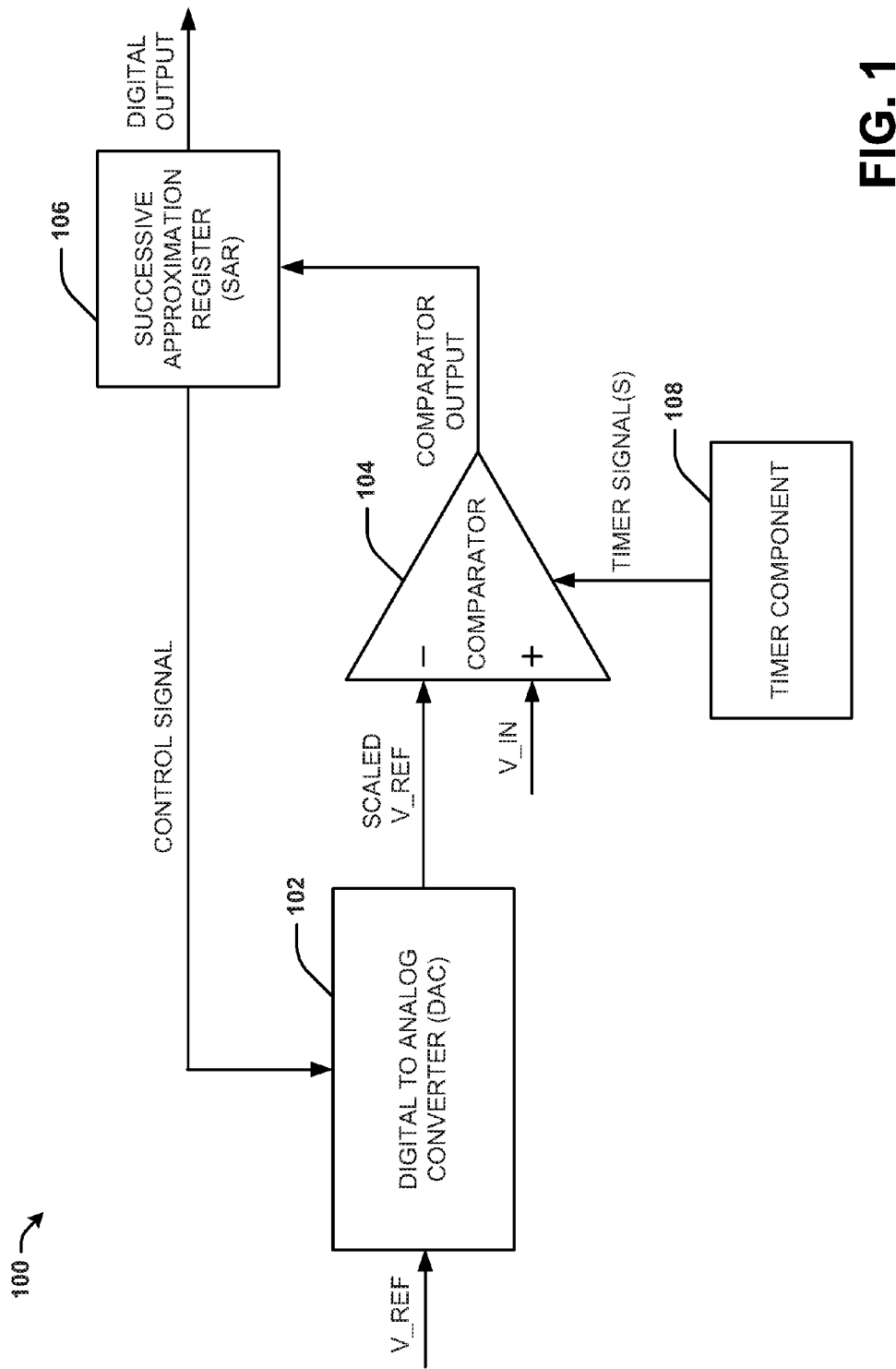
FIG. 1 is a block diagram illustrating an example, non-limiting embodiment of a system in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Various aspects of the present disclosure provide for error reduction due to comparator metastability for an analog to digital converter (ADC). The ADC can be, for example, a successive approximation register (SAR) ADC. The SAR ADC can be configured to perform an analog to digital conversion process for an input voltage. Moreover, a comparison associated with the SAR ADC and/or the analog to digital conversion process can be performed based on a defined period of time. For example, conversion errors under a metastability condition in a SAR based ADC can be limited by defining a maximum comparator conversion time. In an aspect, an output register of the SAR ADC can be loaded with the same digital word as a digital to analog converter in the SAR ADC. A certain period of time (e.g., a certain maximum time) can be defined (e.g., allowed) for a comparator decision associated with the SAR ADC. If there is no decision during the certain period of time, the output register is not updated and content of the output register can become the output word for the input voltage (e.g., content of the output register can become the digital representation of the input voltage). However, if there is a decision during the certain period of time, the output register can be updated with a new digital value (e.g., a new bit value) and the analog to digital conversion process associated with the SAR ADC conversion can continue (e.g., a binary search algorithm associated with the digital to analog converter continues, a next comparison process can be performed, etc.). Accordingly, error associated with output of the SAR ADC (e.g., due to metastability) can be bounded when a partial or complete metastability event occurs in a comparator of the SAR ADC. Moreover, error (e.g., error associated with output of the SAR ADC) due to comparator metastability can be guaranteed to be 1 least significant bit (LSB) or less.

Turning now to FIG. 1, a block diagram illustrating an example, non-limiting embodiment of a system 100 in accordance with various aspects described herein is shown. System 100 includes a digital to analog converter (DAC) 102, a comparator 104 (e.g., a comparator component), a SAR 106 and/or a timer component 108. In an aspect, the DAC 102, the comparator 104, the SAR 106 and/or the timer component 108 can correspond to a SAR ADC. In one implementation, the system 100 can be implemented in connection with an ADC-based receiver (e.g., an ADC-based optical receiver, an ADC-based fiber optic receiver, a high-speed interleaved ADC employed in a high-speed communications receiver, etc.). For example, the system 100 can be associated with a 16 nm 66 Gs/s ADC for an optical receiver. In another implementation, the system 100 can be implemented in connection with a complementary metal-oxide semiconductor (CMOS) system. In yet another implementation, an SAR ADC associated with the system 100 can be a sub-ADC included in a set of SAR ADCs. The system 100 can be employed by various systems, such as, but not limited to microcontroller systems, data acquisition systems, data communication systems, telecommunication systems, other electronic systems, etc. Moreover, the system 100 can be employed to facilitate metastability error reduction associated with an ADC (e.g., an SAR ADC, an asynchronous SAR ADC, etc.).

The DAC 102 can receive a reference voltage (e.g., V_REF shown in FIG. 1). The reference voltage can be an analog reference voltage. In an aspect, the DAC 102 can be implemented as a capacitor array circuit (e.g., a main capacitor array circuit) for an ADC. In one example, the DAC 102 can be a charge scaling circuit (e.g., a charge redistribution circuit) for an ADC. The DAC 102 can be configured to perform a binary search algorithm for converting the input voltage (e.g., V_IN) into a digital representation of the input voltage. The DAC 102 can include a plurality of capacitors (e.g., a plurality of binary-weighted capacitors, a plurality of switched capacitors, a plurality of thermometer-weighted capacitors, etc.). For example, the plurality of capacitors of the DAC 102 can be configured as an array of binary-weighted capacitors and/or an array of thermometer-weighted capacitors that are each individually switched (e.g., a node of each capacitor in the plurality of capacitors can be switched between the reference voltage and ground) based on a control signal (e.g., CONTROL SIGNAL shown in FIG. 1) generated by the SAR 106. The DAC 102 can generate a scaled reference voltage (e.g., SCALED V_REF shown in FIG. 1) based on the reference voltage. The scaled reference voltage can be an analog voltage. The comparator 104 can receive the scaled reference voltage (e.g., SCALED V_REF) generated b the DAC 102. The comparator 104 can also receive an input voltage (e.g., V_IN shown in FIG. 1). The input voltage can be an analog input voltage. In an implementation, the input voltage can be associated with a track and hold feature. For example, the input voltage can be maintained at a certain voltage level based on a track and hold feature. The comparator 104 can be configured to compare the input voltage to the scaled reference voltage. A comparison between the input voltage and the scaled reference voltage can be a comparison associated with an analog to digital conversion process for the input voltage. Therefore, a comparison between the input voltage and the scaled reference voltage can be a single comparison in a set of comparisons associated with an analog to digital conversion process for the input voltage. Based on the scaled reference voltage and the input voltage, the comparator 104 can generate comparator output (e.g., COMPARATOR OUTPUT shown in FIG. 1). In an aspect, the comparator output generated by the comparator 104 can be associated with a digital value (e.g., a single bit value). The SAR 106 can receive the comparator output generated by the comparator 104.

In an aspect, the comparator 104 can be configured to perform a comparison between an input voltage and the scaled reference voltage based on a defined period of time to perform the comparison. For example, the timer component 108 can manage a period of time associated with a comparison by the comparator 104. Each comparison by the comparator 104 can comprise a defined amount of time (e.g., predetermined amount of time, maximum amount of time, etc.) for comparing DAC output and input voltage. In an implementation, the timer component 108 can generate one or more timer signals (e.g., TIMER SIGNAL(S) shown in FIG. 1) to facilitate management of a defined period of time associated with a comparison by the comparator 104. For example, the comparator 104 can start a comparison between the input voltage and the scaled reference voltage in response to a timer signal received from the timer component 108. In another example, the comparator 104 can stop a comparison between the input voltage and the scaled reference voltage in response to another timer signal received from the timer component 108. For example, the other timer signal received from the timer component 108 can signal that the comparator 104 is associated with a metastable condition.

If the comparator 104 finishes the comparison between the input voltage and the scaled reference voltage within the period of time, the comparator output generated by the comparator 104 can be stored in the SAR 106. For example, the SAR 106 can store a digital value (e.g., a bit value) associated with the comparison between the input voltage and the scaled reference voltage in response to a determination that the comparison is completed within the defined period of time. However, if the comparator 104 does not finish a comparison within the period of time (e.g., in response to a determination that the comparison is not completed within the defined period of time), an analog to digital conversion associated with the input voltage can be stopped (e.g., due to the comparator 104 being in a metastable state). For example, operation of the DAC 102 and/or the comparator 104 can be stopped in response to a determination that the comparison is not completed within the defined period of time. The determination that the comparison is not completed within the defined period of time can signal that the comparator 104 is in a metastable state. Additionally or alternatively, a value stored in the SAR 106 can be employed as digital output (e.g., DIGITAL OUTPUT shown in FIG. 1) for the input voltage. For example, a digital value stored in the SAR 106 can be outputted as a digital representation of the input voltage in response to a determination that the comparison is not completed within the defined period of time (e.g., due to the comparator 104 being in a metastable state). As such, a comparison that exceeds a pre-defined period of time (e.g., a defined period of time associated with a comparison by the comparator 104) can be deemed to have entered a metastable state, at which point the comparison can be terminated and digital bits stored thus far in a register (e.g., a value stored in the SAR 106) can be outputted as being a digital value equivalent to an analog input signal (e.g., V_IN) received by an analog to digital converter.

In certain implementations, the timer component 108 can be associated with one or more delay stages to generate the defined period of time (e.g., a delay stage can be employed to implement a maximum allowed comparator decision time). For example, the timer component 108 can include a delay-locked loop (DLL) to facilitate management of the defined period of time. In another example, the timer component 108 can include a ring oscillator phase-locked loop (PLL) to facilitate management of the defined period of time. The timer component 108 can, for example, ensure that if a particular comparison decision takes excessive time to complete, there is still adequate time remaining for other comparison decisions.

The system 100 can limit error in an analog to digital conversion by a SAR ADC that may arise due to metastability during a comparison by a comparator. For example, by employing the timer component 108, the system 100 can bound error associated with the digital output generated by the SAR 106 (e.g., bound the magnitude of error) when a partial or complete metastability event is associated with the comparator 104. Furthermore, the timer component 108 can limit error (e.g., error of the digital output generated by the SAR 106) due to metastability associated with the comparator 104 to 1 LSB or less. Catastrophic errors associated with the DAC 102, the comparator 104 and/or the SAR 106 (e.g., errors equivalent to a large number of bits) can also be avoided. As such, performance and/or bit error rate of an SAR ADC can be improved.

Figure 2:
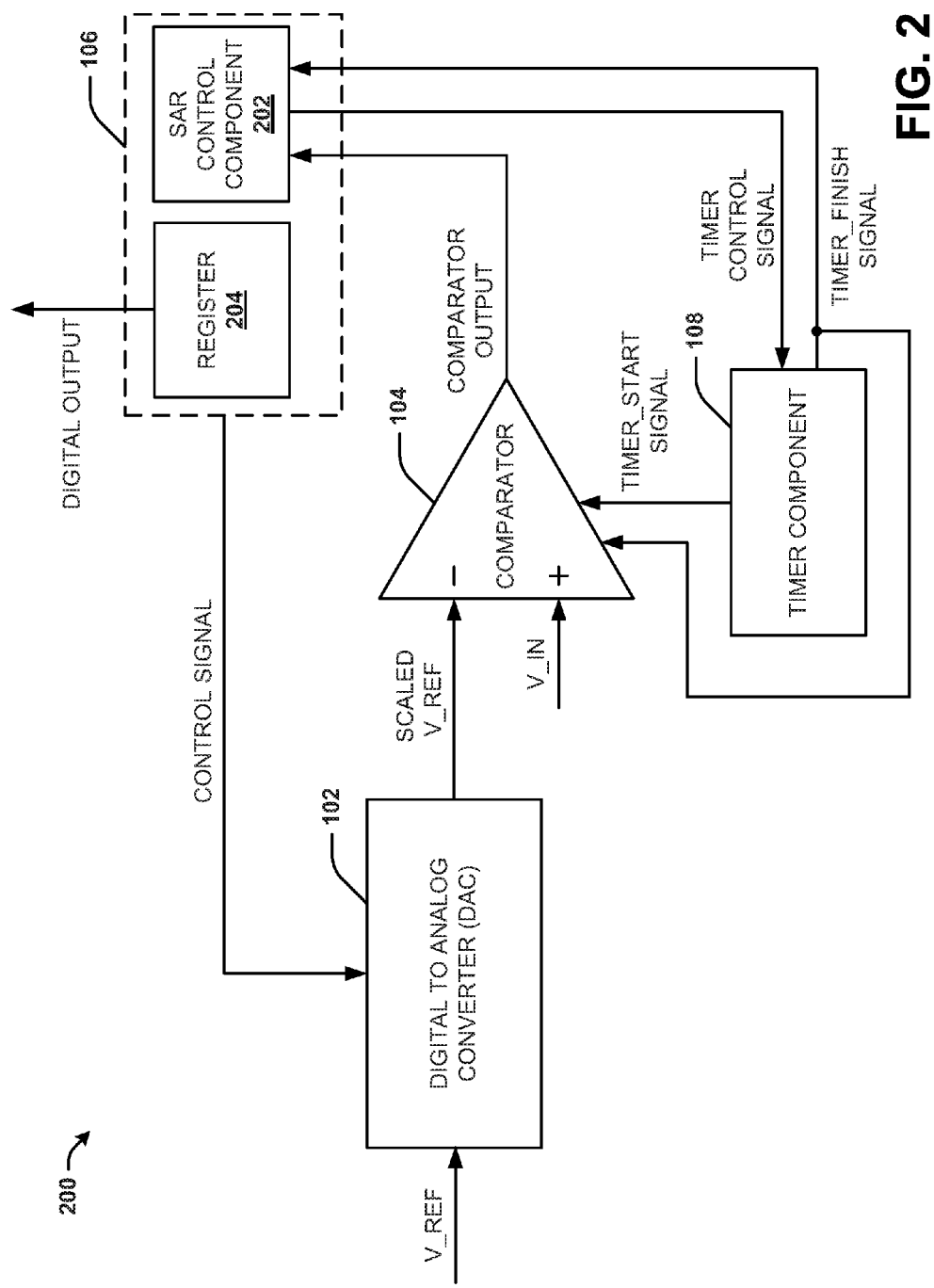
FIG. 2 is a block diagram illustrating an example, non-limiting embodiment of another system in accordance with various aspects described herein.

Referring now to FIG. 2, a block diagram illustrating an example, non-limiting embodiment of a system 200 in accordance with various aspects described herein is shown. System 200 includes the DAC 102, the comparator 104, the SAR 106 and/or the timer component 108. The SAR 106 can include an SAR control component 202 and/or a register 204. The SAR logic component 202 can be an SAR logic control component. In one example, the register 204 can be an N-bit register.

The timer component 108 can generate a timer start signal (e.g., TIMER_START shown in FIG. 2) and/or a timer finish signal (e.g., TIMER_FINISH shown in FIG. 2). In one example, the timer start signal and/or the timer finish signal can correspond to the timer signal(s) shown in FIG. 1. The comparator 104 can receive the timer start signal. For example, the timer component 108 can transmit the timer start signal to the comparator 104 to initiate a comparison between the input voltage and the scaled reference voltage (e.g., to start the defined period of time for a comparison). Additionally, the comparator 104 can receive the timer finish signal. In one example, the timer component 108 can transmit the timer finish signal to the SAR control component 202 in response to a determination that a comparison between the input voltage and the scaled reference voltage is completed within the defined period of time (e.g., to initiate a new comparison for the comparator 104). In another example, the timer component 108 can transmit the timer finish signal to the comparator 104 and/or the SAR control component 202 in response to a determination that a comparison between the input voltage and the scaled reference voltage is not completed within the defined period of time (e.g., to stop a comparison associated with the comparator 104, to initiate output of the digital output stored in the register 204, and/or to signal that the comparator 104 is associated with a metastable condition). The SAR control component 202 can receive the comparator output generated by the comparator 104 and/or the timer finish signal generated by the timer component 108. Based on the comparator output and/or the timer finish signal, the SAR control component 202 can generate a timer control signal (e.g., TIMER CONTROL SIGNAL shown in FIG. 2). The timer control signal can facilitate management of the defined period of time managed by the timer component 108.

The SAR control component 202 and/or the register 204 can be configured to control a binary search algorithm associated with the DAC 102. For example, the register 204 can be configured to generate the control signal to facilitate generation of a certain N-bit value. The DAC 102 can then generate the scaled reference voltage (e.g., SCALED V_REF) based on the certain N-bit value. In an aspect, a value of the scaled reference voltage (e.g., SCALED V_REF) can correspond to a certain fraction of the reference voltage (e.g., V_REF/2, etc.). The comparator 104 can perform a comparison to determine whether the input voltage (e.g., V_IN) is less than or greater than the scaled reference voltage (e.g., SCALED V_REF).

The timer component 108 can control a period of time associated with the comparison by the comparator 104 to determine whether the input voltage (e.g., V_IN) is less than or greater than the scaled reference voltage (e.g., SCALED V_REF). For example, the comparator 104 can start the comparison between the input voltage (e.g., V_IN) and the scaled reference voltage (e.g., SCALED V_REF) in response to the timer start signal generated by the timer component 108. If the comparator 104 completes the comparison between the input voltage (e.g., V_IN) and the scaled reference voltage (e.g., SCALED V_REF) within the period of time, the comparator output generated by the comparator 104 can be stored in the SAR 106 (e.g., if the comparator 104 determines whether the input voltage is less than or greater than the scaled reference voltage within the period of time, the comparator output generated by the comparator 104 can be stored in the SAR 106). In one example, a value of the comparator output can be a logical high value (e.g., a logical "1" bit value) in response to a determination by the comparator 104 that the input voltage (e.g., V_IN) is greater than the scaled reference voltage (e.g., SCALED V_REF) and another determination that the comparator 104 has completed the comparison between the input voltage and the scaled reference voltage within a period of time associated with the timer component 108. A value of the comparator output can be a logical low value (e.g., a logical "0" bit value) in response to a determination by the comparator 104 that the input voltage (e.g., V_IN) is less than the scaled reference voltage (e.g., SCALED V_REF) and another determination that the comparator 104 has completed the comparison between the input voltage and the scaled reference voltage within a period of time associated with the timer component 108.

However, if the comparator 104 does not complete the comparison between the input voltage (e.g., V_IN) and the scaled reference voltage (e.g., SCALED V_REF) within the period of time (e.g., if the comparator 104 does not determine whether the input voltage is less than or greater than the scaled reference voltage within the period of time), an analog to digital conversion process associated with the input voltage can be stopped (e.g., due to the comparator 104 being in a metastable state) and/or data (e.g., a digital word) currently stored in the register 204 be employed as digital output for the input voltage. For example, the register 204 can transmit the digital output (e.g., DIGITAL OUTPUT shown in FIG. 2), which can be a digital representation of the input voltage. Furthermore, it can be determined that the comparator 104 is associated with a metastable condition if the comparator 104 does not complete the comparison between the input voltage (e.g., V_IN) and the scaled reference voltage (e.g., SCALED V_REF) within the period of time. In an aspect, digital data stored in the register 204 can correspond to a digital word associated with the DAC 102. As such, a comparison between the input voltage (e.g., V_IN) and the scaled reference voltage (e.g., SCALED V_REF) that exceeds a certain period of time (e.g., a period of time associated with the comparison between the input voltage and the scaled reference voltage) can be associated with a metastable condition. Furthermore, in response to the metastable condition, the comparison between the input voltage and the scaled reference voltage can be terminated and/or digital data stored in the register 204 can be outputted as being a digital value equivalent to the input voltage (e.g., V_IN). With the timer component 108, error associated with the digital output provided by the register 204 can be minimized. For example, with the timer component 108, the digital output provided by the register 204 can be different than a true digital representation of the input voltage by at most 1 LSB.

Figure 3:
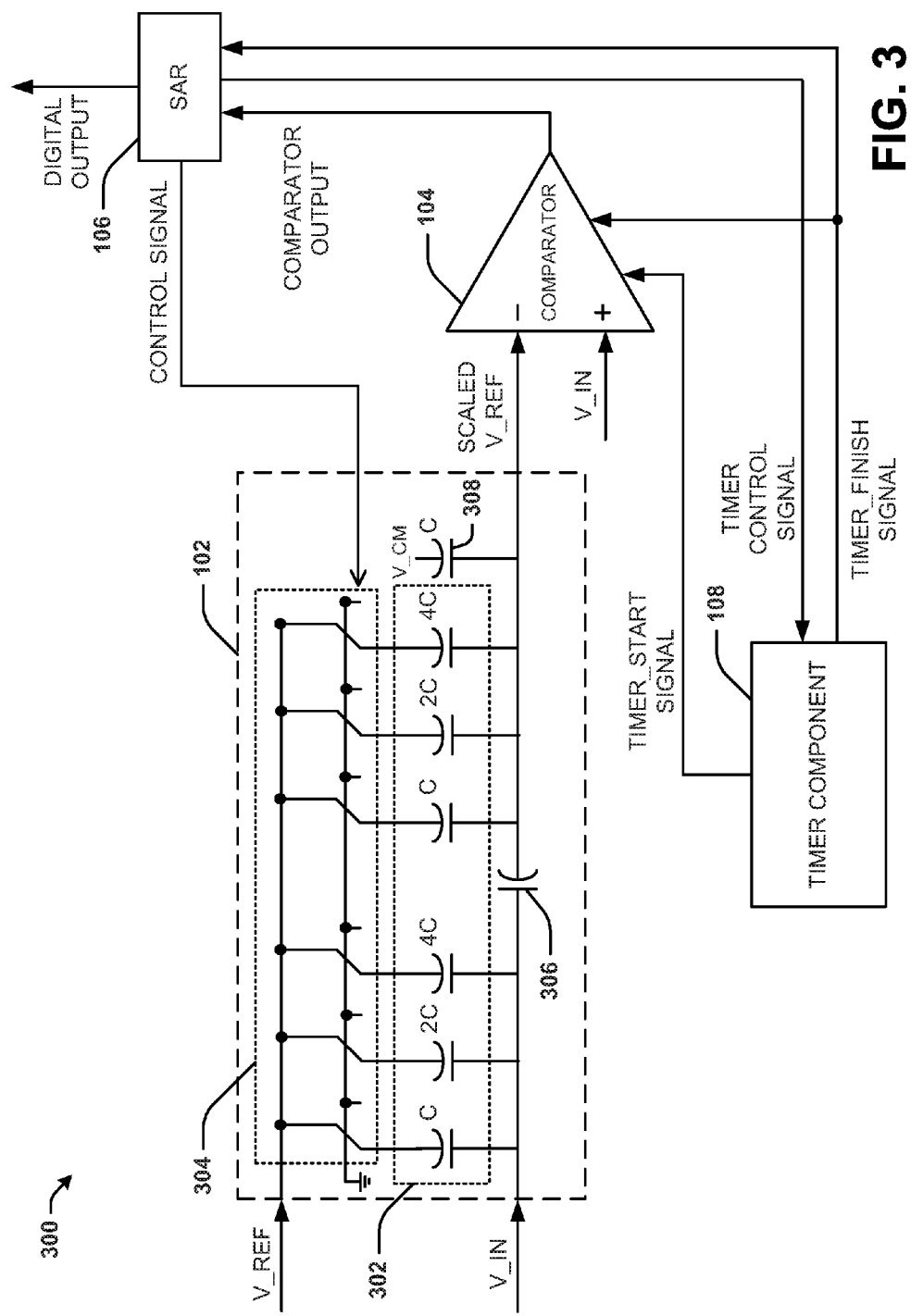
FIG. 3 is a diagram illustrating an example, non-limiting embodiment of yet another system in accordance with various aspects described herein.

Referring now to FIG. 3, a block diagram illustrating an example, non-limiting embodiment of a system 300 in accordance with various aspects described herein is shown. System 300 includes the DAC 102, the comparator 104, the SAR 106 and/or the timer component 108. The SAR 106 can include the SAR control component 202 and/or the register 204. The DAC 102 can include a plurality of capacitors 302. For example, the plurality of capacitors 302 can be a plurality binary-weighted capacitors (e.g., a plurality of switched capacitors) or a plurality of thermometer-weighted capacitors. The plurality of capacitors 302 can be configured to generate the scaled reference voltage (e.g., SCALED V_REF). Additionally, the capacitor array component 102 can include a set of switches 304. The set of switches 304 can be controlled based on the control signal generated by the SAR 106. For example, each switch from the set of switches 304 can be switched to the reference voltage (e.g., V_REF) or ground based on the control signal generated by the SAR 106. In an implementation, the plurality of capacitors 302 and the set of switches 304 can correspond to a charge redistribution component. In the example shown in FIG. 3, the plurality of capacitors 302 includes a first set of capacitors and a second set of capacitors with capacitors corresponding to values C, 2C and 4C, where C corresponds to a capacitance value. However, it is to be appreciated that number of capacitors and/or capacitor values included in the plurality of capacitors 302 can be varied based on a particular implementation.

In an aspect, the capacitor array component 102 can also include a capacitor 306 (e.g., a bridge capacitor). The capacitor 306 can be configured to control a capacitor size (e.g., capacitance value) for each of the plurality of capacitors 302. For example, the capacitor 306 can scale down values of capacitors included in the plurality of capacitors 302 (e.g., to reduce effective weight of capacitors included in the plurality of capacitors 302). Additionally or alternatively, the capacitor array component 102 can also include a capacitor 308. The capacitor 308 can be a LSB capacitor (e.g., a dummy LSB capacitor) associated with the plurality of capacitors 302.

In a non-limiting example, a most significant bit (MSB) can be tested by connecting a corresponding capacitor to the reference voltage (V_REF), by detecting completion of a comparator decision associated with the comparator 104, by keeping or resetting the bit based on a comparator decision associated with the comparator 104, and by continuing this process by testing a next MSB. Instead of merely loading comparator output associated with the comparator 104 into the register 104 every time a comparator decision associated with the comparator 104 is completed, the register 204 can be loaded with the same digital data (e.g., digital word) as the DAC 102. Moreover, the timer component 108 can manage a defined period of time for the comparator decision associated with the comparator 104 (e.g., a particular maximum time for the comparator decision associated with the comparator 104), and if the comparator decision associated with the comparator 104 is not completed during the defined period of time, the register 204 is not updated and content of the register can become the digital output. However, if the comparator decision associated with the comparator 104 is completed during the defined period of time, the register 204 can be updated with comparator output generated by the comparator 104 and the analog to digital conversion process associated with the input voltage (e.g., operation of the DAC 102, the comparator 104 and/or the SAR logic component 202) can continue.

Figure 4:
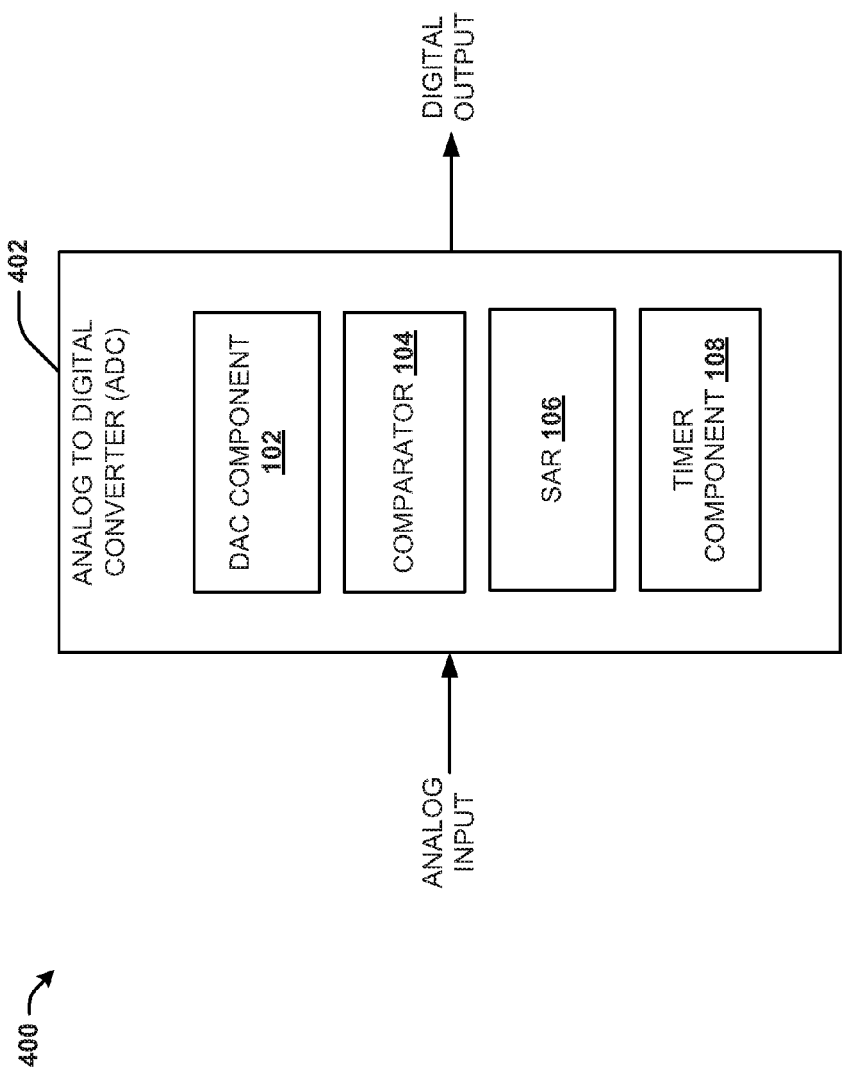
FIG. 4 is a block diagram illustrating an example, non-limiting embodiment of an analog to digital converter in accordance with various aspects described herein.

Referring now to FIG. 4, a block diagram illustrating an example, non-limiting embodiment of a system 400 in accordance with various aspects described herein is shown. System 400 includes an ADC 402. In one example, the ADC 402 can be an SAR ADC. The ADC 402 can include the DAC component 102, the comparator 104, the SAR 106 and/or the timer component 108.

The ADC 402 can receive analog input (e.g., ANALOG INPUT shown in FIG. 4) and can generate digital output (e.g., DIGITAL OUTPUT shown in FIG. 4). The analog input can be an analog signal that corresponds to the input voltage (e.g., V_IN) shown in FIGS. 1-3. The digital output can be a digital signal that corresponds to the digital output shown in FIGS. 1-3. The digital output can be a digital representation of the analog input. The ADC 402 can implement error reduction for the comparator 104 via at least the timer component 108. For example, the digital output can be at most 1 least significant bit different than a true digital representation of the analog input.

Figure 5:
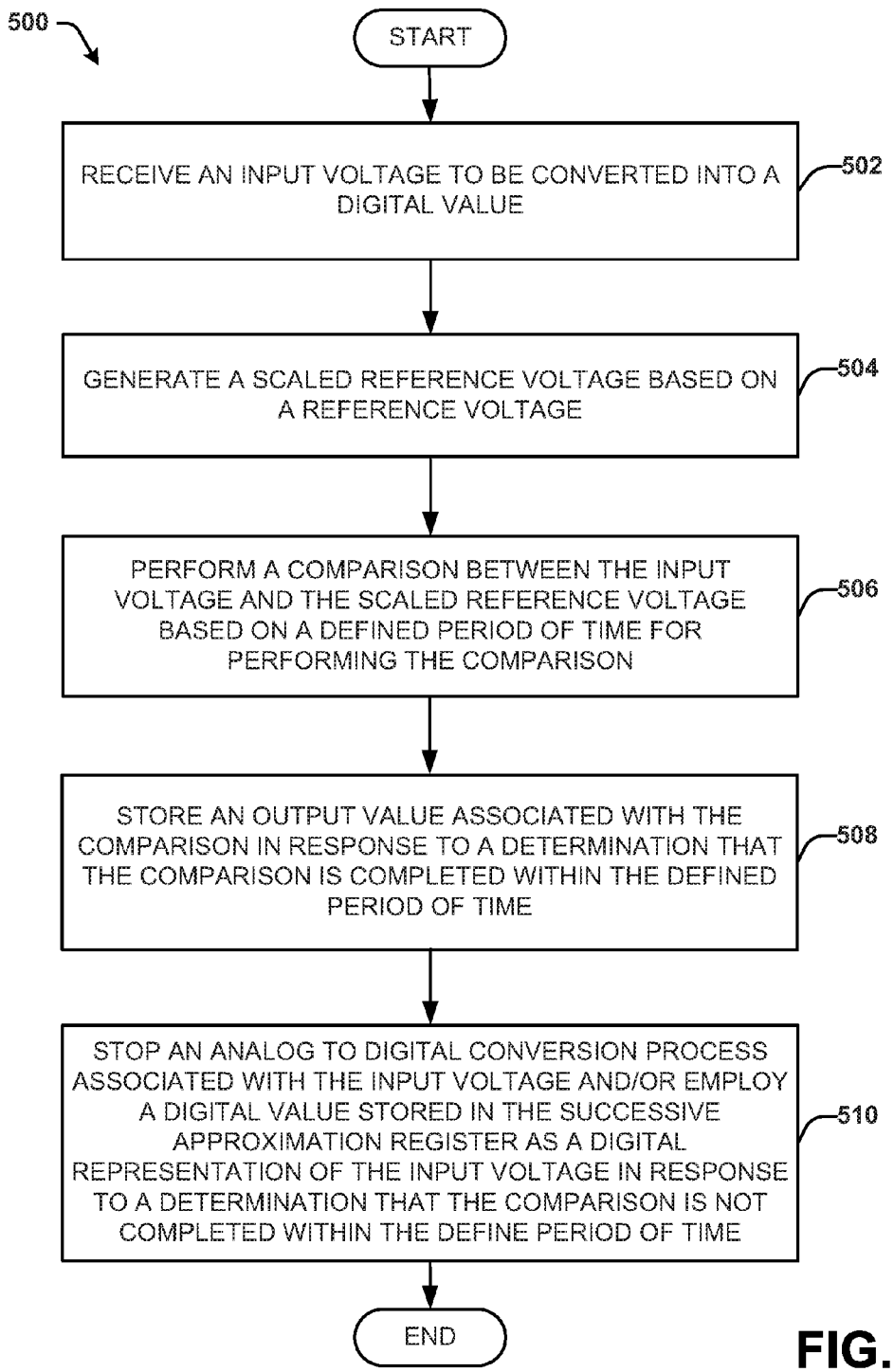
FIG. 5 illustrates a flow diagram of an example, non-limiting embodiment of a method for reducing error associated with analog to digital converter in accordance with various aspects described herein.
Figure 6:
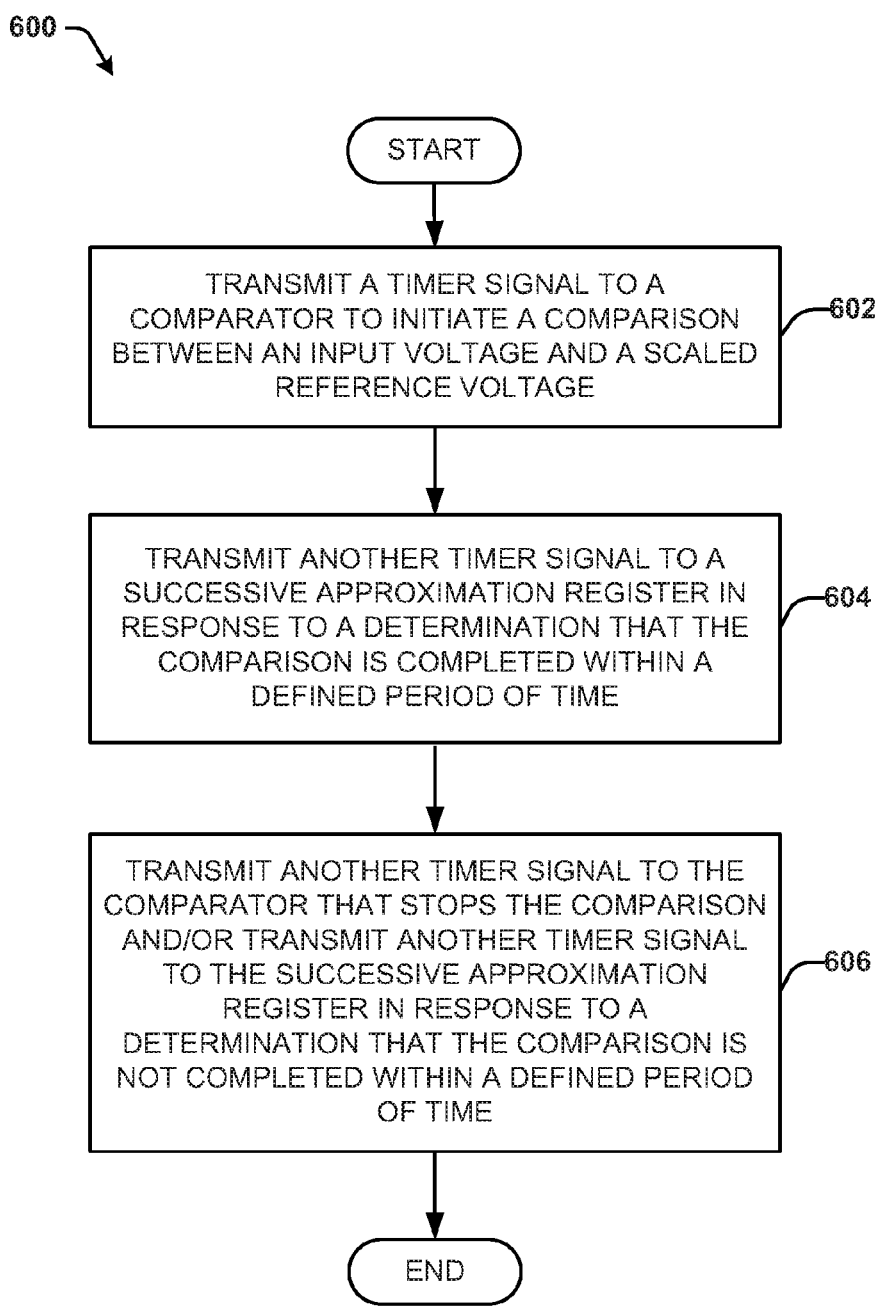
FIG. 6 illustrates a flow diagram of another example, non-limiting embodiment of a method for reducing error associated with an analog to digital converter in accordance with various aspects described herein.
Figure 7:
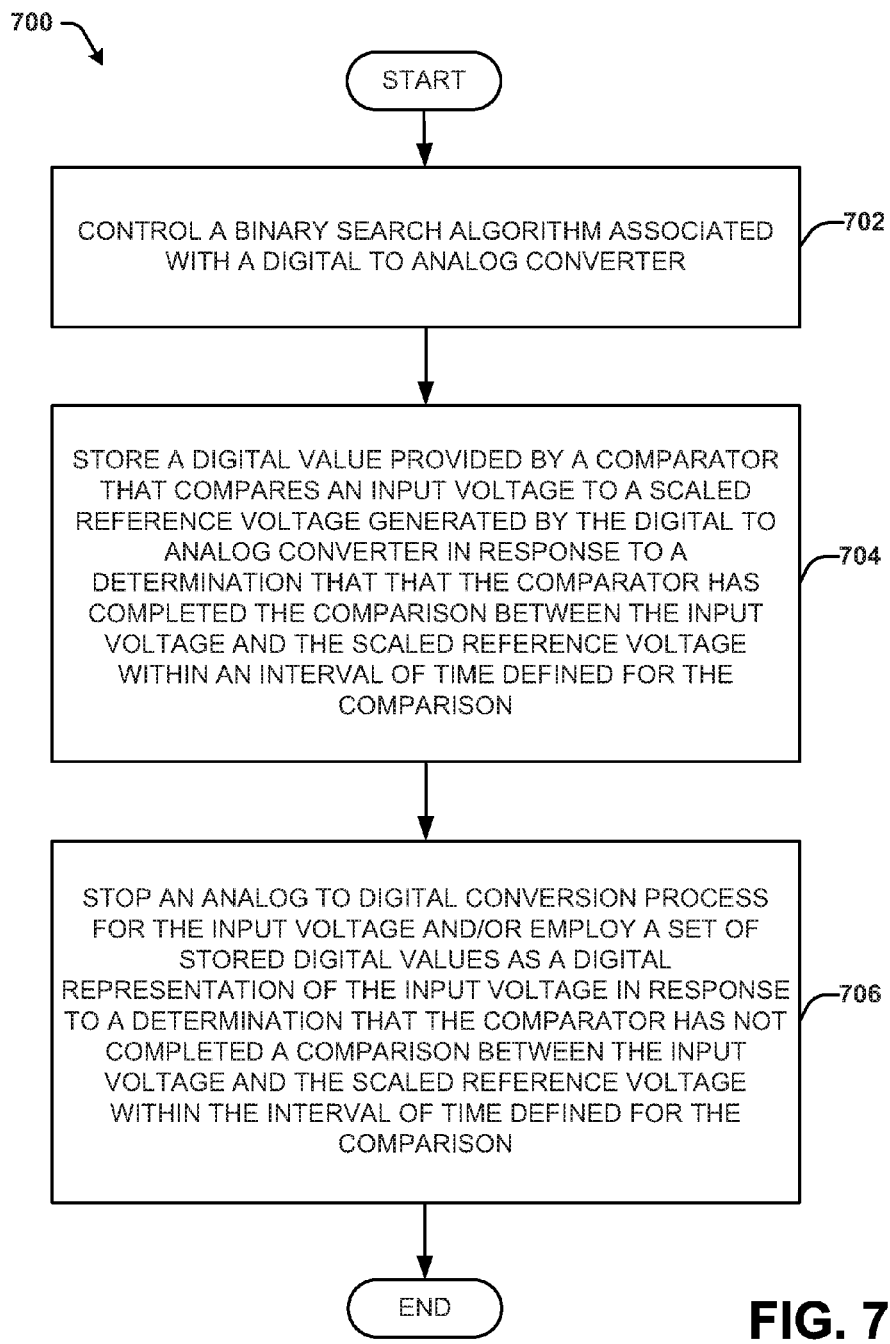
FIG. 7 illustrates a flow diagram of yet another example, non-limiting embodiment of a method for reducing error associated with an analog to digital converter in accordance with various aspects described herein.

In view of the example systems described above, methods that may be implemented in accordance with the described subject matter may be better appreciated with reference to the flow charts of FIGS. 5-7. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring to FIG. 5, a flow diagram of an example, non-limiting embodiment of a method for reducing error associated with an analog to digital converter is shown. Method 500 can begin at block 502, where an input voltage to be converted into a digital value is received (e.g., by a comparator 104). For example, an input voltage to be converted into a digital value can be received by a comparator (e.g., comparator 104) and/or a DAC (e.g., DAC 102). At block 504, a scaled reference voltage is generated based on a reference voltage. For example, a scaled reference voltage can be generated by a DAC (e.g., DAC 102) based on a reference voltage received by the DAC.

At block 506, a comparison is performed between the input voltage and the scaled reference voltage based on a defined period of time for performing the comparison. For example, a comparator (e.g., comparator 104) can begin comparing the input voltage to the scaled reference voltage in response to receiving a command signal (e.g., receiving a timer signal from a timer component 108). Furthermore, the comparator (e.g., comparator 104) can continue comparing the input voltage to the scaled reference voltage until the comparison between the input voltage and the scaled reference voltage is complete or until another timer signal is received.

At block 508, an output value associated with the comparison is stored (e.g., by a register 204) in response to a determination that the comparison is completed within the defined period of time. For example, a digital value determined by the comparator (e.g., comparator 104) can be stored in a successive approximation register in response to a determination that the comparator has not received a command to stop the comparison.

At block 510, an analog to digital conversion process associated with the input voltage is stopped in response to a determination that the comparison is not completed within the defined period of time. Additionally or alternatively, a digital value stored in the successive approximation register is employed as a digital representation of the input voltage in response to a determination that the comparison is not completed within the defined period of time. For example, operation of the DAC and/or the comparator can be halted in response to a determination that the comparison is not completed within the defined period of time (e.g., due to the comparator being in a metastable state). Furthermore, it can be determined that the comparator is associated with a metastable condition in response to the determination that the comparison is not completed within the defined period of time. Additionally or alternatively, a digital word stored in the successive approximation register can be outputted in response to a determination that the comparison is not completed within the defined period of time.

Referring to FIG. 6, a flow diagram of an example, non-limiting embodiment of a method for reducing error associated with an analog to digital converter is shown. Method 600 can begin at block 602, where a timer signal is transmitted to a comparator to initiate a comparison between an input voltage and a scaled reference voltage. For example, a timer component (e.g., timer component 108) can transmit a command to a comparator (e.g., comparator 104) to initiate a comparison between an input voltage and a scaled reference voltage. The input voltage can be an analog voltage to be converted into a digital value. The scaled reference can be generated by a DAC (e.g., based on a reference voltage). In one example, the DAC can include a plurality binary-weighted capacitors and/or a set of switches. In another example, the DAC can include a plurality thermometer-weighted capacitors and/or a set of switches.

At block 604, another timer signal is transmitted to a successive approximation register in response to a determination that the comparison is completed within a defined period of time. For example, the successive approximation register (e.g., SAR 106) can control a binary search algorithm associated with the DAC. Furthermore, the successive approximation register can store one or more digital values generated by the comparator (e.g., generated in response to one or more comparisons associated with an analog to digital conversion process) in response to a determination that the comparison is completed within a defined period of time. The defined period of time can be an interval of time defined for the comparison. The other timer signal transmitted to the successive approximation register (e.g., in response to a determination that the comparison is completed within a defined period of time) can inform the successive approximation register that the comparison is successfully completed within the defined period of time and/or can initiate a next comparison for the comparator.

At block 606, another timer signal is transmitted to the comparator that stops the comparison in response to a determination that the comparison is not completed within a defined period of time. Additionally or alternatively, another timer signal is transmitted to the successive approximation register in response to a determination that the comparison is not completed within a defined period of time. For example, the timer component (e.g., timer component 108) can transmit another command to the comparator (e.g., comparator 104) to stop a comparison being performed by the comparator. Additionally or alternatively, the timer component (e.g., timer component 108) can transmit another command to the successive approximation register (e.g., SAR 106) to instruct the successive approximation register to output a digital word stored in the successive approximation register. Additionally or alternatively, another signal (e.g., another timer signal or another type of signal) can be generated and/or transmitted to signal that the comparator is associated with a metastable condition.

Referring to FIG. 7, a flow diagram of an example, non-limiting embodiment of a method for reducing error associated with an analog to digital converter is shown. Method 700 can begin at block 702, where a binary search algorithm associated with a digital to analog converter is controlled. For example, an SAR (e.g., SAR control component 202) can control a binary search algorithm associated with a digital to analog converter to facilitate an analog to digital conversion process for an input voltage.

At block 704, a digital value provided by a comparator that compares an input voltage to a scaled reference voltage generated by the digital to analog converter is stored in response to a determination that that the comparator has completed the comparison between the input voltage and the scaled reference voltage within an interval of time defined for the comparison. In one example, a bit value (e.g., a bit value of "1") can be stored in an SAR (e.g., register 204) in response to a determination that the input voltage is greater than the scaled reference voltage and in response to another determination that that the comparator (e.g., comparator 104) has completed the comparison between the input voltage and the scaled reference voltage within an interval of time defined for the comparison. In another example, a bit value (e.g., a bit value of "0") can be stored in an SAR (e.g., register 204) in response to a determination that the input voltage is less than the scaled reference voltage and in response to another determination that that the comparator (e.g., comparator 104) has completed the comparison between the input voltage and the scaled reference voltage within an interval of time defined for the comparison.

At block 706, an analog to digital conversion process for the input voltage is stopped in response to a determination that the comparator has not completed a comparison between the input voltage and the scaled reference voltage within the interval of time defined for the comparison. Additionally or alternatively, a set of stored digital values is employed as a digital representation of the input voltage in response to a determination that the comparator has not completed a comparison between the input voltage and the scaled reference voltage within the interval of time defined for the comparison. For example, operation of the digital to analog converter and/or the comparator can be halted in response to a determination that the comparator has not completed a comparison between the input voltage and the scaled reference voltage within the interval of time defined for the comparison (e.g., due to the comparator being in a metastable state). Additionally or alternatively, a digital word stored in the SAR (e.g., register 204) can be employed as a digital representation of the input voltage in response to a determination that the comparator has not completed a comparison between the input voltage and the scaled reference voltage within the interval of time defined for the comparison. The determination that the comparator has not completed the comparison between the input voltage and the scaled reference voltage within the interval of time defined for the comparison can be an indicator that the comparator is in a metastable state.

Example Computing Environment

As mentioned, advantageously, the techniques described herein can be applied to any device where it is desirable to reduce error associated with an analog to digital converter (e.g., to reduce error reduction due to comparator metastability for an analog to digital converter) in connection with the various non-limiting embodiments, i.e., anywhere that a device may wish to reduce error associated with an analog to digital converter. Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 8 thus illustrates an example of a suitable computing system environment 800 in which some aspects of the disclosed subject matter can be implemented (e.g., a timer component, etc.), although as made clear above, the computing system environment 800 is only one example of a suitable computing environment for a device and is not intended to suggest any limitation as to the scope of use or functionality of the disclosed subject matter. Neither should the computing environment 800 be interpreted as having any dependency or requirement relating to any one or combination of components illustrated in the exemplary operating environment 800.

With reference to FIG. 8, an exemplary device for implementing the disclosed subject matter includes a general-purpose computing device in the form of a computer 810. Components of computer 810 may include, but are not limited to, a processing unit 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures.

Computer 810 typically includes a variety of computer readable media. Computer readable media can be any available media that can be accessed by computer 810. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 810. Communication media typically embodies computer readable instructions, data structures, program modules, or other data in a modulated data signal such as a carrier wave or other transport mechanism and includes any information delivery media.

The system memory 830 may include computer storage media in the form of volatile and/or nonvolatile memory such as read only memory (ROM) and/or random access memory (RAM). A basic input/output system (BIOS), containing the basic routines that help to transfer information between elements within computer 810, such as during start-up, may be stored in memory 830. Memory 830 typically also contains data and/or program modules that are immediately accessible to and/or presently being operated on by processing unit 820. By way of example, and not limitation, memory 830 may also include an operating system, application programs, other program modules, and program data.

The computer 810 may also include other removable/non-removable, volatile/nonvolatile computer storage media. For example, computer 810 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 821 through a non-removable memory interface such as an interface, and a magnetic disk drive or optical disk drive is typically connected to the system bus 821 by a removable memory interface, such as an interface.

A user can enter commands and information into the computer 810 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 820 through user input 840 and associated interface(s) that are coupled to the system bus 821, but may be connected by other interface and bus structures, such as a parallel port, game port, or a universal serial bus (USB). A graphics subsystem can also be connected to the system bus 821. A projection unit in a projection display device, or a HUD in a viewing device or other type of display device can also be connected to the system bus 821 via an interface, such as output interface 850, which may in turn communicate with video memory. In addition to a monitor, computers can also include other peripheral output devices such as speakers which can be connected through output interface 850.

The computer 810 can operate in a networked or distributed environment using logical connections to one or more other remote computer(s), such as remote computer 870, which can in turn have media capabilities different from computer 810. The remote computer 870 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 810. The logical connections depicted in FIG. 8 include a network 871, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 810 can be connected to the LAN 871 through a network interface or adapter. When used in a WAN networking environment, the computer 810 can typically include a communications component, such as a modem, or other means for establishing communications over the WAN, such as the Internet. A communications component, such as wireless communications component, a modem and so on, which can be internal or external, can be connected to the system bus 821 via the user input interface of input 840, or other appropriate mechanism. In a networked environment, program modules depicted relative to the computer 810, or portions thereof, can be stored in a remote memory storage device. It will be appreciated that the network connections shown and described are exemplary and other means of establishing a communications link between the computers can be used.

Reference throughout this specification to "one embodiment," "an embodiment," "an example," "a disclosed aspect," "an aspect", or "an implementation" means that a particular feature, structure, or characteristic described in connection with the embodiment or aspect is included in at least one embodiment or aspect of the present disclosure. Thus, the appearances of the phrase "in one embodiment," "in one aspect," "in an example," or "in an implementation," etc. in various places throughout this specification are not necessarily all referring to the same embodiment. Furthermore, the particular features, structures, or characteristics may be combined in any suitable manner in various disclosed embodiments.

As utilized herein, terms "component," "system," "circuit," "register," "comparator," "architecture," and the like are intended to refer to a computer or electronic-related entity, either hardware, a combination of hardware and software, software (e.g., in execution), or firmware. For example, in certain implementations, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. In certain implementations, a component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that Manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An analog to digital converter system, comprising:
a digital to analog converter configured for generating a scaled reference voltage based on a reference voltage; and
a comparator component configured for performing a comparison between an input voltage and the scaled reference voltage based on a period of time that defines a maximum amount of time for the comparator component to perform the comparison, wherein a digital value previously stored in a register is outputted as a digital representation of the input voltage in response to a determination that the comparison is not completed within the period of time that defines the maximum amount of time for the comparator component to perform the comparison.

2. The analog to digital converter system of claim 1, wherein the comparator is configured for stopping the comparison performed by the comparator component in response to a timer signal received from a timer component.

3. The analog to digital converter system of claim 1, wherein the determination is a first determination, and wherein the register is configured for storing comparator output associated with the comparison in response to a second determination that the comparison is completed within the period of time.

4. The analog to digital converter system of claim 3, further comprising a timer component configured for transmitting a timer signal to a control component in response to the second determination that the comparison is completed within the period of time.

5. The analog to digital converter system of claim 1, wherein an analog to digital conversion process for the input voltage is stopped in response to the determination that the comparison is not completed within the period of time due to the comparator component being in a metastable state.

6. The analog to digital converter system of claim 1, wherein the register is not updated and the digital value previously stored in the register is outputted as the digital representation of the input voltage in response to the determination that the comparison is not completed within the period of time.

7. The analog to digital converter system of claim 1, wherein the digital to analog converter comprises a plurality binary-weighted capacitors or a plurality of thermometer-weighted capacitors.

8. The analog to digital converter system of claim 1, wherein the input voltage and the scaled reference voltage are analog voltage signals.

9. An error reduction method, comprising:
receiving an input voltage to be converted into a digital value;
generating a scaled reference voltage based on a reference voltage;
performing a comparison between the input voltage and the scaled reference voltage based on a period of time that defines a maximum amount of time for performing the comparison; and
outputting data previously stored in a successive approximation register as a digital representation of the input voltage in response to a determination that the comparison is not completed within the period of time that defines the maximum amount of time for the performing the comparison.

10. The error reduction method of claim 9, wherein performing the comparison comprises starting the comparison in response to a command signal.

11. The error reduction method of claim 9, further comprising storing an output value associated with the comparison in response to another determination that the comparison is completed within the period of time.

12. The error reduction method of claim 9, further comprising transmitting a timer signal to the successive approximation register in response to another determination that the comparison is completed within the period of time.

13. The error reduction method of claim 9, wherein the outputting comprises stopping an analog to digital conversion process associated with the input voltage in response to the determination that the comparison is not completed within the period of time.

14. The error reduction method of claim 9, wherein the outputting comprises outputting a digital value that is different than a true digital representation of the input voltage in response to a determination that the comparison is not completed within the period of time.

15. A successive approximation register, comprising:
a register configured for storing a digital value provided by a comparator that compares an input voltage to a scaled reference voltage generated by a digital to analog converter; and
a control component configured for controlling a binary search algorithm associated with the digital to analog converter, wherein a set of digital values previously stored in the register is employed as a digital representation of the input voltage in response to a determination that the comparator has not completed a comparison between the input voltage and the scaled reference voltage within an interval of time due to the comparator being in a metastable state, and wherein the interval of time defines a maximum amount of time for the comparator to perform the comparison.

16. The successive approximation register of claim 15, wherein an analog to digital conversion process for the input voltage is stopped in response to the determination that the comparator has not completed the comparison between the input voltage and the scaled reference voltage within the interval of time.

17. The successive approximation register of claim 15, wherein the register is configured for storing the digital value provided by the comparator in response to another determination that the comparator has completed the comparison between the input voltage and the scaled reference voltage within the interval of time.

18. The successive approximation register of claim 15, wherein the control component is configured for receiving a timer signal in response to another determination that the comparison has completed the comparison between the input voltage and the scaled reference voltage within the interval of time.

19. The successive approximation register of claim 15, wherein the comparator is configured for starting the comparison in response to a timer signal.

20. The successive approximation register of claim 15, wherein the scaled reference voltage is generated based on a reference voltage.

* * * * *